US008952462B2

(12) United States Patent
Chen et al.

(10) Patent No.: US 8,952,462 B2
(45) Date of Patent: Feb. 10, 2015

(54) METHOD AND APPARATUS OF FORMING A GATE

(75) Inventors: Jian-Hao Chen, Hsinchu (TW);
Da-Yuan Lee, Jhubei (TW);
Kuang-Yuan Hsu, Fongyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 468 days.

(21) Appl. No.: 12/700,901

(22) Filed: Feb. 5, 2010

(65) Prior Publication Data

US 2011/0193180 A1 Aug. 11, 2011

(51) Int. Cl.
*H01L 29/94* (2006.01)
*H01L 27/108* (2006.01)
(Continued)

(52) U.S. Cl.
CPC .... *H01L 21/28194* (2013.01); *H01L 21/02148* (2013.01); *H01L 21/02181* (2013.01); *H01L 21/022* (2013.01); *H01L 21/0228* (2013.01); *H01L 29/513* (2013.01); *H01L 29/517* (2013.01); *H01L 29/495* (2013.01); *H01L 29/4966* (2013.01); *H01L 29/665* (2013.01)
USPC ........... 257/411; 257/297; 257/349; 257/402; 257/547; 257/620; 438/166; 438/187; 438/287; 438/290; 438/301

(58) Field of Classification Search
CPC .............. H01L 21/02; H01L 21/28273; H01L 21/28282
USPC ................ 257/297, 349, 402, 411, 547, 620, 257/E29.007, E29.165, E21.159, E21.443; 438/166, 187, 287, 290, 301, FOR. 121, 438/FOR. 243, FOR. 244, FOR. 253
See application file for complete search history.

(56) References Cited

U.S. PATENT DOCUMENTS 7,365,389 B1 * 4/2008 Jeon et al. ...................... 257/325
2001/0046756 A1 * 11/2001 Helm ............................ 438/510
(Continued)

FOREIGN PATENT DOCUMENTS

CN 101752317 6/2010

OTHER PUBLICATIONS

G. Pant et al., "Comparison of Electrical and Chemical Characteristics of Ultrathin HfON Versus HfSiON Dielectrics", Applied Physics Letters 89, 032904 (2006), 3 pages.
(Continued)

*Primary Examiner* — Mamadou Diallo
*Assistant Examiner* — Joannie A Garcia
(74) *Attorney, Agent, or Firm* — Haynes and Boone, LLP (57) ABSTRACT

The present disclosure provides an apparatus that includes a semiconductor device. The semiconductor device includes a substrate. The semiconductor device also includes a first gate dielectric layer that is disposed over the substrate. The first gate dielectric layer includes a first material. The first gate dielectric layer has a first thickness that is less than a threshold thickness at which a portion of the first material of the first gate dielectric layer begins to crystallize. The semiconductor device also includes a second gate dielectric layer that is disposed over the first gate dielectric layer. The second gate dielectric layer includes a second material that is different from the first material. The second gate dielectric layer has a second thickness that is less than a threshold thickness at which a portion of the second material of the second gate dielectric layer begins to crystallize.

20 Claims, 11 Drawing Sheets

(51) Int. Cl.
*H01L 21/02* (2006.01)
*H01L 21/28* (2006.01)
*H01L 29/51* (2006.01)
*H01L 29/49* (2006.01)
*H01L 29/66* (2006.01)

(56) References Cited

U.S. PATENT DOCUMENTS

2006/0054943 A1* 3/2006 Li et al. .................. 257/266
2008/0079061 A1* 4/2008 Ding et al. .............. 257/324
2009/0263948 A1* 10/2009 Kim ........................ 438/275
2010/0025730 A1* 2/2010 Heikman et al. ........ 257/194
2010/0109044 A1* 5/2010 Tekleab et al. .......... 257/190
2010/0124818 A1* 5/2010 Lee et al. ................ 438/589

OTHER PUBLICATIONS

M. Zacharias et al., "Thermal Crystallization of Amorphous Si/SiO2 Superlattices", Applied Physics Letters, vol. 74, No. 18, May 3, 1999, 3 pages.

Chinese Patent Office, Office Action dated Apr. 13, 2012, Application No. 201110006025.9, 4 pages.

* cited by examiner

METHOD AND APPARATUS OF FORMING A GATE

TECHNICAL FIELD

The present disclosure relates generally to a semiconductor device, and more particularly, to a gate of a semiconductor device.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. Current IC fabrication processes may require one or more annealing processes at relatively high temperatures. However, these high temperature annealing processes may cause portions of gates of the IC to crystallize. The crystallized portions of the gates provide carrier transportation paths and may result in or contribute to gate leakage currents.

Therefore, while existing methods of fabricating semiconductor gates have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

One of the broader forms of the present disclosure involves an apparatus that includes a semiconductor device. The semiconductor device includes, a substrate; a first gate dielectric layer having a first material and being disposed over the substrate, the first gate dielectric layer having a first thickness that is less than a first threshold thickness at which a portion of the first material of the first gate dielectric layer begins to crystallize; and a second gate dielectric layer having a second material and being disposed over the first gate dielectric layer, the second gate dielectric layer having a second thickness that is less than a second threshold thickness at which a portion of the second material of the second gate dielectric layer begins to crystallize; wherein the second material is different from the first material.

Another of the broader forms of the present disclosure involves an apparatus that includes a semiconductor device. The semiconductor device includes, a substrate; and a gate structure disposed over the substrate, the gate structure including a dielectric portion and an electrode portion that is disposed over the dielectric portion; wherein the dielectric portion includes a plurality of laminated layers that each have a thickness that is less than approximately 0.8 nanometers.

Yet another of the broader forms of the present disclosure involves a method of fabricating a semiconductor device. The method includes, providing a substrate; forming a first gate dielectric layer having a first material over the substrate, the first gate dielectric layer having a first thickness that is less than a first threshold thickness at which a portion of the first material of the first gate dielectric layer begins to crystallize; and forming a second gate dielectric layer having a second material over the first gate dielectric layer, the second gate dielectric layer having a second thickness that is less than a second threshold thickness at which a portion of the second material of the second gate dielectric layer begins to crystallize; wherein the second material is different from the first material.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
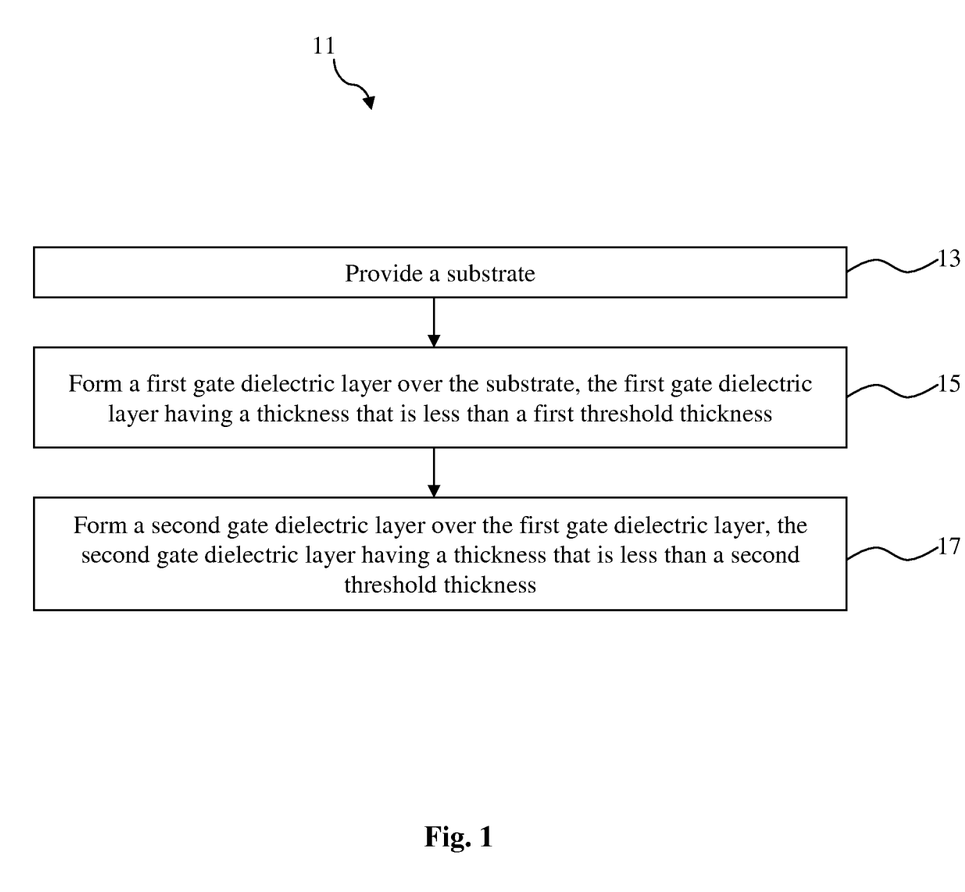
FIG. 1 is a flowchart illustrating a method of fabricating a semiconductor device according to various aspects of the present disclosure.

Illustrated in FIG. 1 is a flowchart of a method 11 for fabricating a semiconductor device. FIGS. 2-10 are diagrammatic fragmentary cross-sectional side views of the semiconductor device during various fabrication stages. The semiconductor device may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-10 have been simplified for a better understanding of the inventive concepts of the present disclosure. Accordingly, it should be noted that additional processes may be provided before, during, and after the method 11 of FIG. 1, and that some other processes may only be briefly described herein.

Referring to FIG. 1, the method 11 begins with block 13 in which a substrate is provided. The method 11 continues with block 15 in which a first gate dielectric layer is formed over the substrate. The first gate dielectric layer has a high-k dielectric material. The first gate dielectric layer has a thickness that is less than a first threshold thickness. The first threshold thickness is a thickness at which a portion of the first gate dielectric layer begins to crystallize. The method 11 continues with block 17 in which a second gate dielectric layer is formed over the first gate dielectric layer. The second gate dielectric layer has a high-k dielectric material that is different from the high-k dielectric material of the first gate dielectric layer. The second gate dielectric layer has a thickness that is less than a second threshold thickness. The second threshold thickness is a thickness at which a portion of the second gate dielectric layer begins to crystallize.

Figure 2:
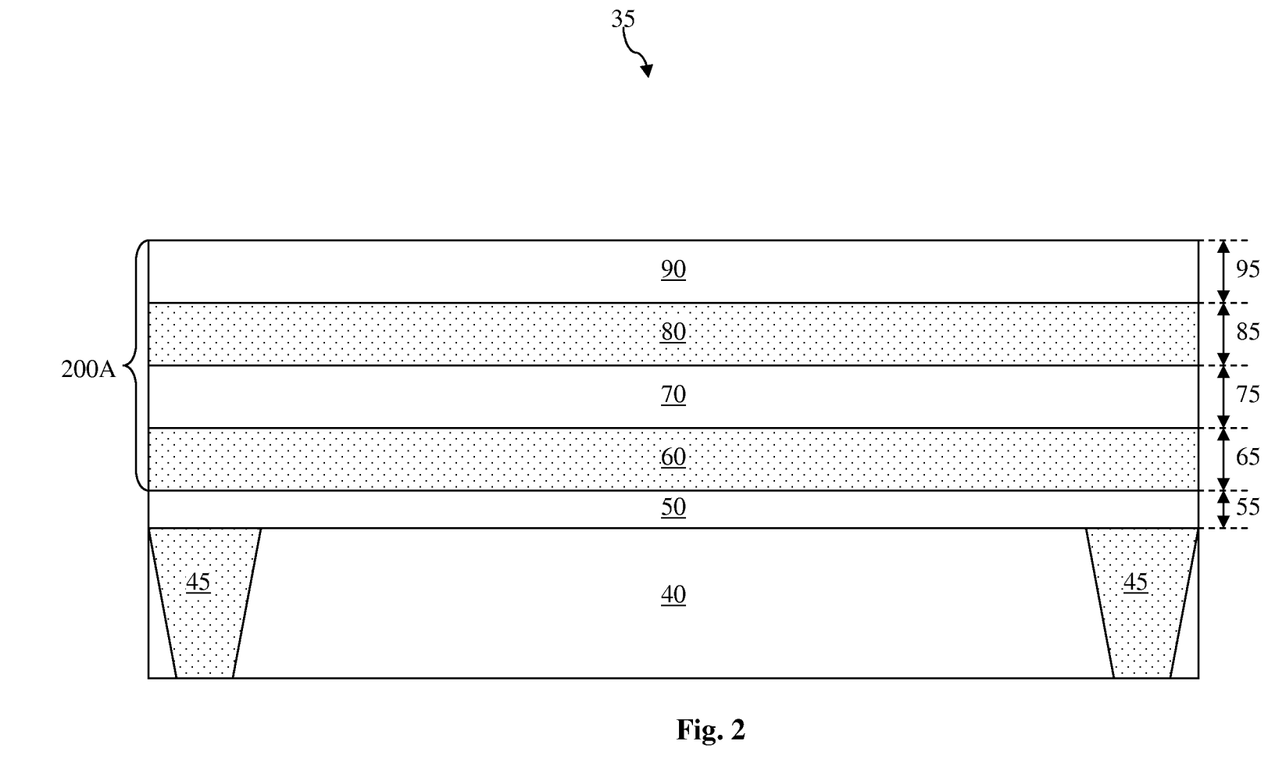
FIGS. 2 to 10 illustrate cross-sectional views of the semiconductor device at various stages of fabrication according to the method of FIG. 1.

Referring to FIG. 2, a semiconductor device 35 is fabricated in accordance with the method 11 of FIG. 1. The semiconductor device 35 has a substrate 40. The substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Referring back to FIG. 2, shallow trench isolation (STI) features 45 are formed in the substrate 40. The STI features 45 are formed by etching recesses (or trenches) in the substrate 45 and filling the recesses with a dielectric material. In an embodiment, the dielectric material of the STI features 45 includes silicon oxide. In alternative embodiments, the dielectric material of the STI features 45 may include silicon nitride, silicon oxy-nitride, fluoride-doped silicate (FSG), and/or a low-k dielectric material known in the art.

Thereafter, an interfacial layer 50 is optionally formed over the substrate 40. The interfacial layer 50 is formed by an atomic layer deposition (ALD) process and includes silicon oxide ($SiO_2$). The interfacial layer 50 may alternatively be formed by a thermal oxidation process or formed by a series of wet and/or dry surface treatments. The interfacial layer 50 has a thickness 55 that is in a range from approximately 0.3 nanometers (nm) to approximately 1.5 nm.

A dielectric layer 60 is then formed over the interfacial layer 50. The dielectric layer 60 is formed by an ALD process. The ALD process includes repeating deposition cycles, with each cycle including a step of introducing a metal precursor (for example, $HfCl_4$ as Hf source) to the reactive surface, a purge step, a second precursor or oxidant (for example, $H_2O$) introduction step, and a purge step. The dielectric layer 60 can also be deposited using chemical vapor deposition (CVD), physical vapor deposition (PVD), sputtering, or any suitable combinations thereof. The dielectric layer 60 includes a high-k dielectric material. A high-k dielectric material is a material having a dielectric constant that is greater than a dielectric constant of $SiO_2$, which is approximately 4. In an embodiment, the dielectric layer 60 includes hafnium oxide ($HfO_2$), which has a dielectric constant that is in a range from approximately 15 to approximately 30. The dielectric layer 60 has a thickness 65 that is less than a threshold thickness that will be discussed in more detail below. In an embodiment, the thickness 65 is less than approximately 0.8 nm. In alternative embodiments, the dielectric layer 60 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO, and may have a different value as the thickness 65.

Referring back to FIG. 2, a dielectric layer 70 is formed over the dielectric layer 60. The dielectric layer 70 is formed by an ALD process. The ALD process includes repeating deposition cycles, with each cycle including a step of introducing a metal precursor (for example, $ZrCl_4$ as Zr source) to the reactive surface, a purge step, a second precursor or oxidant (for example, $H_2O$) introduction step, and a purge step. The dielectric layer 70 can also be deposited using chemical vapor deposition (CVD), physical vapor deposition (PVD), sputtering, or any suitable combination thereof. The dielectric layer 70 includes a high-k dielectric material that is different from the high-k dielectric material of the dielectric layer 60. In an embodiment, the dielectric layer 70 includes zirconium oxide (ZrO), which has a dielectric constant that is in a range from approximately 15 to approximately 30. The dielectric layer 70 has a thickness 75 that is less than a threshold thickness that will be discussed in more detail below. In an embodiment, the thickness 75 is less than approximately 0.8 nm. In an alternative embodiment, the dielectric layer 70 includes hafnium silicate ($HfSiO_4$). In other embodiments, the dielectric layer 70 may include one of SiO, SiN, AlO, HfO, YO, LaO, GdO, TiO, TaO, HfSiO, ZrSiO, TiSiO, TaSiO, HfErO, HfLaO, HfYO, HfGdO, HfAlO, HfZrO, HfTiO, HfTaO, and SrTiO, and may have a different value as the thickness 75.

Referring back to FIG. 2, a dielectric layer 80 is formed over the dielectric layer 70. The dielectric layer 80 is formed by an ALD process (or another suitable process) substantially similar to the process used to form the dielectric layer 60 and includes a material that is substantially similar to the material of the dielectric layer 60. The dielectric layer 80 has a thickness 85 that is less than the threshold thickness discussed above with reference to the dielectric layer 60. In an embodiment, the thickness 85 is less than approximately 0.8 nm.

A dielectric layer 90 is formed over the dielectric layer 80. The dielectric layer 90 is formed by an ALD process substantially similar to the process used to form the dielectric layer 70 and includes a material that is substantially similar to the material of the dielectric layer 70. The dielectric layer 90 has a thickness 95 that is less than the threshold thickness discussed above with reference to the dielectric layer 70. In an embodiment, the thickness 95 is less than approximately 0.8 nm.

The dielectric layers 60, 70, 80, and 90 together form a laminated gate dielectric layer 200A of the semiconductor device 35. For existing gate structures fabricated using traditional processes, gate leakage current often results after the gate undergoes an annealing process at a relatively high temperature, for example at a temperature in a range between 700 degrees Celsius and 1200 degrees Celsius. One of the reasons for the gate leakage current is that, the annealing process may cause portions of materials within the gate dielectric layer to crystallize from a near-amorphous phase to a monoclinic phase. The crystallized portions of the gate dielectric layer are also referred to as "grains". Grain boundaries—the interfaces between the grains—provide carrier transportation paths, which result in or increase the gate leakage current.

As such, it may be desirable to increase a crystallization temperature of a gate dielectric, so that even as the gate undergoes annealing processes at relatively high temperatures, minimum crystallization will occur within the gate. Doping the gate dielectric layer with silicon and/or nitrogen may be one way to increase the crystallization temperature of the gate. However, this type of doping would also lower the value of the dielectric constant of the gate dielectric layer, which undermines the performance of the gate and is therefore undesired. Reducing the thickness of the gate dielectric layer may also increase the crystallization temperature of the gate. Yet a gate dielectric layer with a reduced thickness may also be prone to gate leakage, since it is less capable of withstanding the voltage applied at the gate (gate voltage), particularly as the gate voltage increases. Thus, it is desirable to have a gate dielectric layer that can achieve a high crystallization temperature without an increased overall thickness and without being doped.

The laminated gate dielectric layer 200A offers many advantages, it being understood that different embodiments may offer different advantages, and that no particular advantage is necessarily required for all embodiments. One of the advantages offered by the laminated gate dielectric layer 200A includes reduced gate leakage current due in part to a higher crystallization temperature. For the dielectric layers 60, 70, 80, and 90, the crystallization temperature of each of the layers is determined by two energies: a bulk energy and an interfacial energy. A ratio of the bulk energy to the interfacial energy is correlated to the thicknesses 65, 75, 85, and 95 of the dielectric layers 60, 70, 80, and 90, respectively. As the thicknesses 65, 75, 85, and 95 decrease, the ratio of the bulk energy to the interfacial energy within the respective layers 60, 70, 80, and 90, decreases as well. In other words, as the dielectric layers 60, 70, 80, and 90 become thinner, the interfacial energy within each of the layers begins to dominate over the bulk energy. As the interfacial energy begins to dominate, the dielectric layers 60, 70, 80, and 90 require more outside energy to crystallize, thus raising the crystallization temperature for each of the layers. It has been observed that embodiments of the dielectric layers 60, 70, 80, and 90 each have a crystallization temperature that is greater than approximately 800 degrees Celsius. Consequently, the laminated gate dielectric layer 200A has a crystallization temperature that is greater than approximately 800 degrees Celsius as well. In addition, as the thicknesses 65, 75, 85, and 95 become smaller, it is increasingly more difficult for bigger grains to form. When the thicknesses 65, 75, 85, and 95 become sufficiently small, it has been observed that practically no crystals will form in the layers 60, 70, 80, and 90, respectively, even as the annealing temperatures increase beyond 1000 degrees Celsius. These sufficiently small thicknesses may be referred to as threshold thicknesses, which are mentioned above. The threshold thickness is dependent on the particular material, so in some embodiments, the dielectric layers 60 and 80 may have different threshold thicknesses compared to the dielectric layers 70 and 90. In the embodiment shown in FIG. 2, the threshold thicknesses for each of the layers 60, 70, 80, and 90 are approximately 0.8 nm.

As discussed above, the thicknesses 65, 75, 85, and 95 of the respective dielectric layers 60, 70, 80, and 90 are each less than approximately 0.8 nm (or less than approximately the threshold thickness). This means that the dielectric layers 60, 70, 80, and 90 will be substantially free of crystals or grains even after undergoing high temperature annealing processes. In some less than ideal conditions, whatever grains that do form will have relatively smaller sizes, which will not contribute much to the gate leakage current.

Furthermore, the laminated thin layer structure of the gate dielectric layer 200A may reduce gate leakage current that is attributable to grain boundary alignment. In a traditional single gate dielectric layer, a grain may form that exhibits itself as a column-like structure that extends substantially through the gate dielectric layer (for example, from a gate electrode above the gate dielectric layer to the substrate below the gate dielectric layer). Alternatively, a plurality of grains may form within the gate dielectric layer, where the grain boundaries are somewhat "vertically" aligned, such that they resemble the single column-like crystal structure. These aligned grain boundaries provide an easier transportation path for the carriers from the gate electrode to the substrate. Consequently, gate leakage current would increase. However, in the laminated gate dielectric structure shown in FIG. 2, even if portions of the layers 60, 70, 80, and 90 are crystallized into grains, it is unlikely that these grain boundaries will be aligned. As such, there are no easy carrier transportation paths, which results in reduced gate leakage current.

Simultaneously to achieving a reduced gate leakage current, the laminated gate dielectric layer 200A requires no doping that would lower the dielectric constant value nor an increased overall thickness. Each of the layers 60, 70, 80, and 90 of the laminated gate dielectric layer 200A includes a high-k material, thus the overall dielectric constant of the laminated gate dielectric layer remains high. The deposition process can also be tuned to change the thicknesses 65, 75, 85, and 95 of the respective layers 60, 70, 80, and 90. Thus, the overall thickness of the laminated gate dielectric layer 200A can be maintained to be substantially the same by tuning the individual thicknesses 65, 75, 85, and 95. Hence, the laminated gate dielectric layer 200A offers desired advantages of high crystallization temperature and lower leakage current without sacrificing either the dielectric constant or the overall thickness.

Since the dielectric layers 60 and 80 are substantially similar, and the dielectric layers 70 and 90 are substantially similar, it may be said that the laminated gate dielectric layer 200A has interleaving (also may be referred to as alternating or periodic) layers (or sub-layers). In other words, the processes of forming the layers 60 and 70 may be essentially repeated to complete the fabrication of the laminated gate dielectric layer 200A. It is understood that although FIG. 2 shows the dielectric layers 60 and 70 being essentially repeated only once, in alternative embodiments the dielectric layers 60 and 70 may be essentially repeated multiple times, depending on design needs and manufacturing concerns. Also in alternative embodiments, the laminated gate dielectric layer 200A may also include 3, 4, or more layers of dielectric material. These layers of dielectric material may or may not be the same as the layers 60, 70, 80, or 90.

Figure 3:
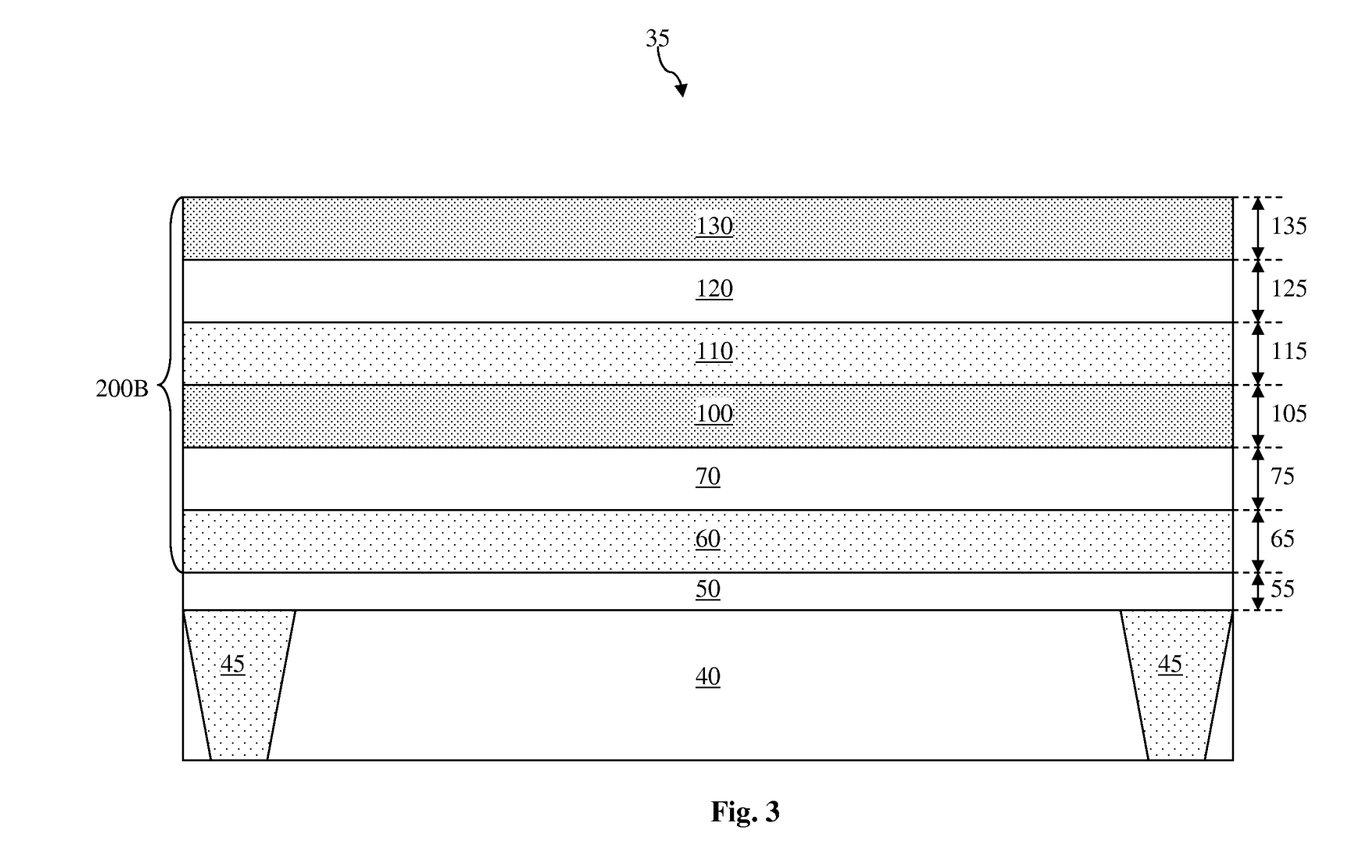

FIG. 3 shows an alternative embodiment of the laminated gate dielectric layer illustrated as 200B. For the sake of consistency and simplicity, similar materials are labeled the same as in FIG. 2, and the details of which will not be discussed herein. As is illustrated in FIG. 3, a dielectric layer 100 is formed over the dielectric layer 70. The dielectric layer 100 is formed by an ALD process and includes a high-k dielectric material that is different from the high-k dielectric material of the dielectric layers 60 and 70. The ALD process includes repeating deposition cycles, with each cycle including a step of introducing a metal precursor to the reactive surface, a purge step, a second precursor or oxidant introduction step, and a purge step. The dielectric layer 100 can also be deposited using a chemical vapor deposition (CVD), physical vapor deposition (PVD), sputtering, or any suitable combinations thereof. In an embodiment, the dielectric layer 100 includes one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, SiO, SiN, AlO, HfO, YO, LaO, GdO, TiO, TaO, HfSiO, ZrSiO, TiSiO, and TaSiO. The dielectric layer 100 has a thickness 105 that is less than a threshold thickness at which portions of the dielectric layer 100 begins to crystallize. In an embodiment, the thickness 105 is less than approximately 0.8 nm.

A dielectric layer 110 is then formed over the dielectric layer 100. The dielectric layer 110 is formed by an ALD process substantially similar to the process used to form the dielectric layer 60 and includes a material that is substantially similar to the material of the dielectric layer 60. The dielectric layer 110 has a thickness 115 that is approximately less than 0.8 nm.

A dielectric layer 120 is then formed over the dielectric layer 110. The dielectric layer 120 is formed by an ALD process substantially similar to the process used to form the dielectric layer 70 and includes a material that is substantially similar to the material of the dielectric layer 70. The dielectric layer 120 has a thickness 125 that is approximately less than 0.8 nm.

A dielectric layer 130 is then formed over the dielectric layer 120. The dielectric layer 130 is formed by an ALD process substantially similar to the process used to form the dielectric layer 100 and includes a material that is substantially similar to the material of the dielectric layer 100. The dielectric layer 130 has a thickness 135 that is approximately less than 0.8 nm.

Thus, the laminated gate dielectric layer 200B includes three different interleaving dielectric layers 60, 70, and 100 that are essentially repeated. These interleaving dielectric layers 60, 70, and 100 may be repeated more than once depending on design needs and manufacturing concerns. Similar to the laminated gate dielectric layer 200A, the interfacial energy dominates within each of the dielectric layers 60, 70, 100, 110, 120, and 130 of the laminated gate dielectric layer 200B. Thus, each of these dielectric layers 60, 70, 100, 110, 120, and 130 has a crystallization temperature that is greater than approximately 800 degrees Celsius. Consequently, the laminated gate dielectric layer 200B has a crystallization temperature that is greater than approximately 800 degrees Celsius.

Figure 4:
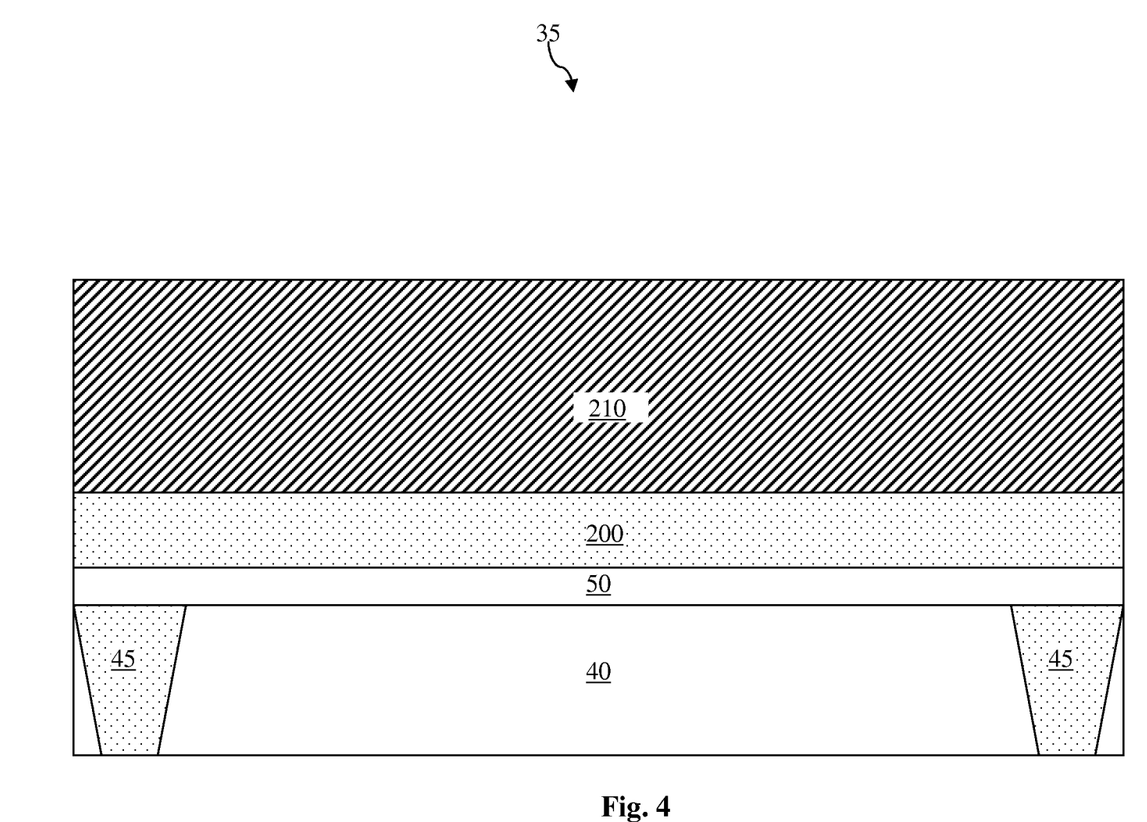

FIGS. 4-10 illustrate further processing performed to fabricate the semiconductor device 35. For reasons of simplicity and clarity, the individual dielectric layers 60, 70, 80, and 90 (or the dielectric layers 60, 70, 100, 110, 120, and 130) of the laminated gate dielectric layer 200A or 200B are not shown. Instead, the laminated gate dielectric layer 200A or 200B is shown as a single structure. Referring now to FIG. 4, a gate electrode layer 210 is formed over the laminated gate dielectric layer 200. The gate electrode layer 210 includes a polysilicon material. It is understood that the gate electrode layer 210 may either be used in a "gate first" process or be used as a dummy gate electrode in a "gate last" process described later.

Figure 5:
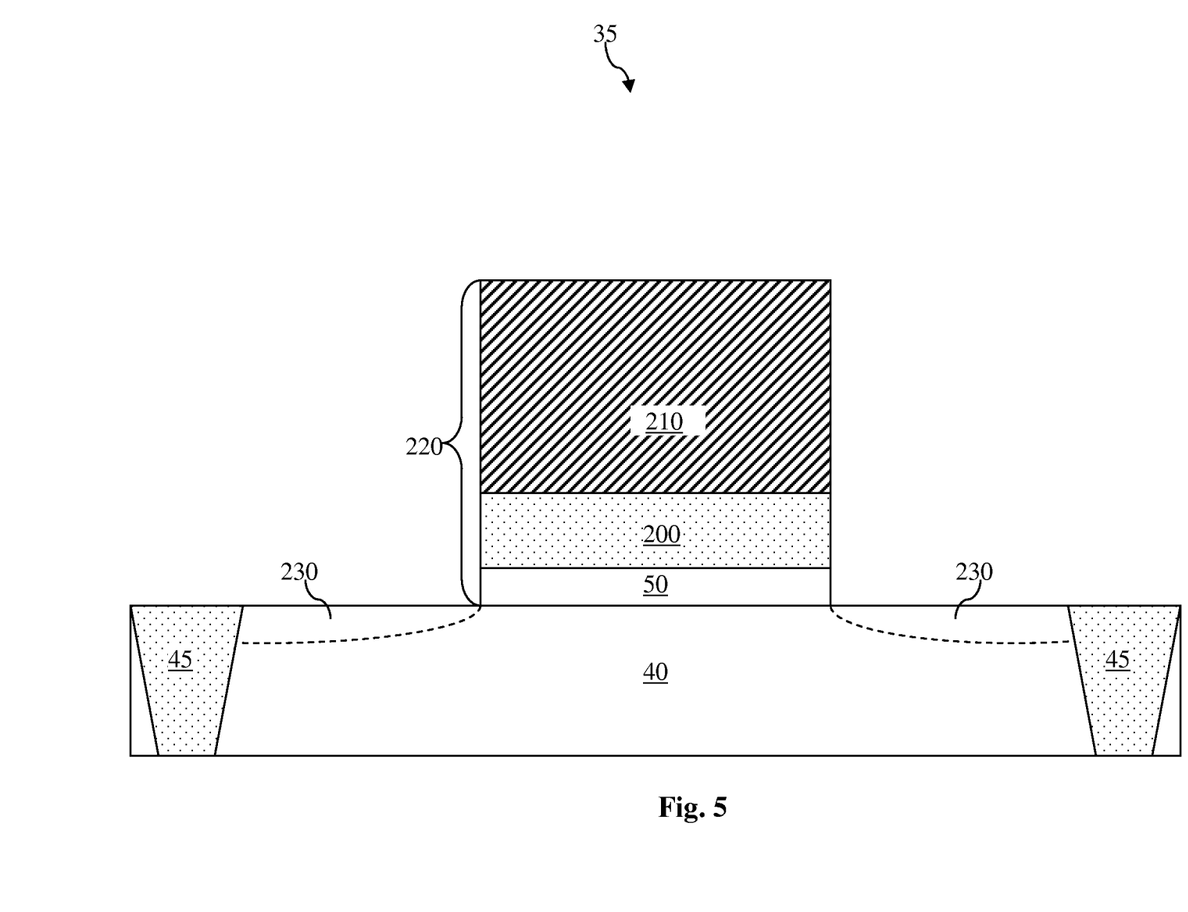

Referring to FIG. 5, the interfacial layer 50, the gate dielectric layer 200, and the gate electrode layer 210 are patterned using a photolithography process known in the art to form a gate structure 220 (also referred to as a gate stack) of the semiconductor device 35. Thereafter, lightly doped source/drain (also referred to as LDD) regions 230 are formed in portions of the substrate 40 on either side of the gate structure 220. The LDD regions 230 may be formed by an ion implantation process or a diffusion process known in the art. N-type dopants such as phosphorus or arsenic may be used to form the semiconductor device as an NMOS device, and P-type dopants such as boron may be used to form the semiconductor device 35 as a PMOS device.

Figure 6:
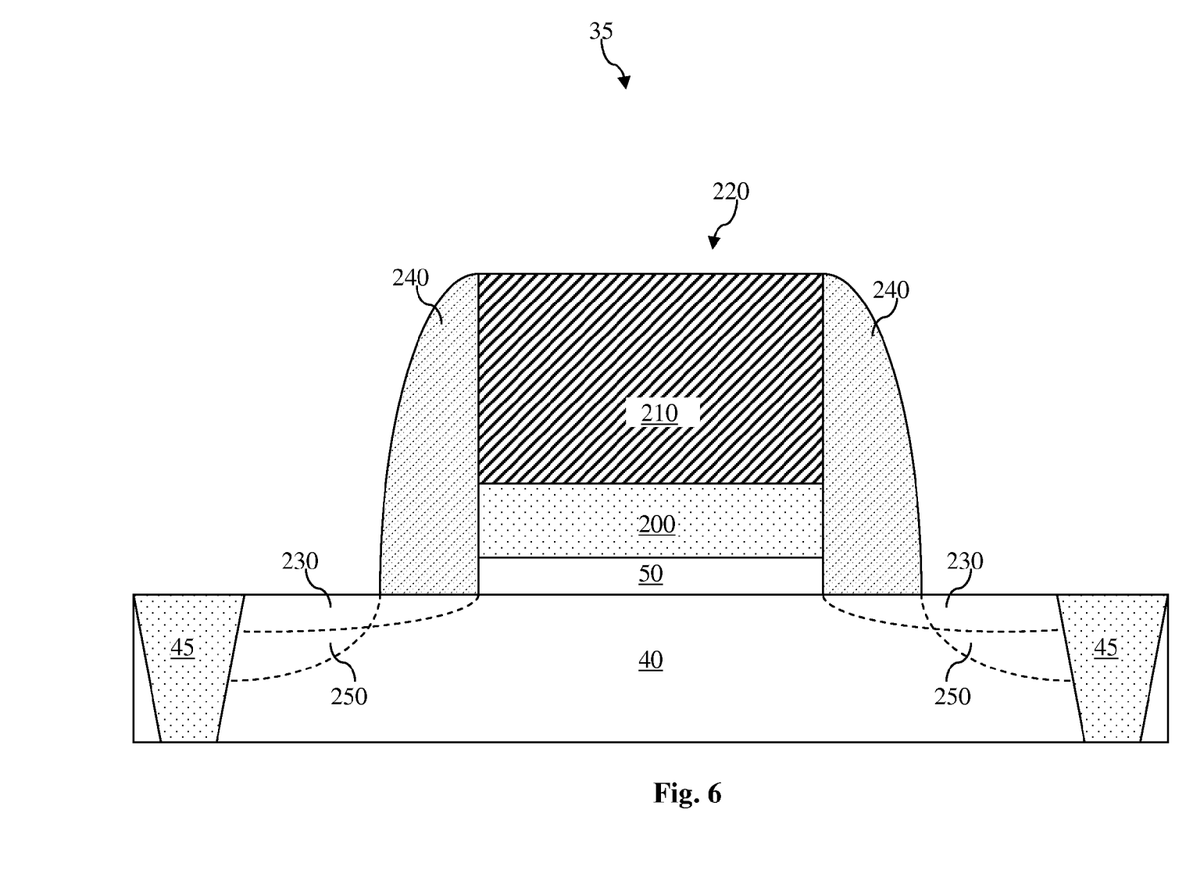

Referring to FIG. 6, gate spacers 240 are formed over the substrate 40 and on either side of the gate structure 220 using a deposition process and an etching process (for example, an anisotropic etching process) known in the art. The gate spacers 240 include a suitable dielectric material such as silicon nitride, silicon oxide, silicon carbide, silicon oxy-nitride, or combinations thereof. Thereafter, heavily doped source and drain regions 250 (also referred to as S/D regions) are formed in portions of the substrate 40 on either side of the gate structure 220. The S/D regions 250 may be formed by an ion implantation process or a diffusion process known in the art. N-type dopants such as phosphorus or arsenic may be used to form the semiconductor device as an NMOS device, and P-type dopants such as boron may be used to form the semiconductor device 35 as a PMOS device. The S/D regions 250 are aligned with the gate spacers 240.

Although not illustrated, one or more annealing processes are performed on the semiconductor device 35 to activate the S/D regions 250. These annealing processes may have relatively high temperatures (such as temperatures greater than approximately 700 degrees Celsius) and may be performed before or after the CMP process 270. As discussed above, the laminated gate dielectric layer 200 is capable of withstanding such high annealing temperatures without crystallizing, thus reducing potential gate leakage current.

Figure 7:
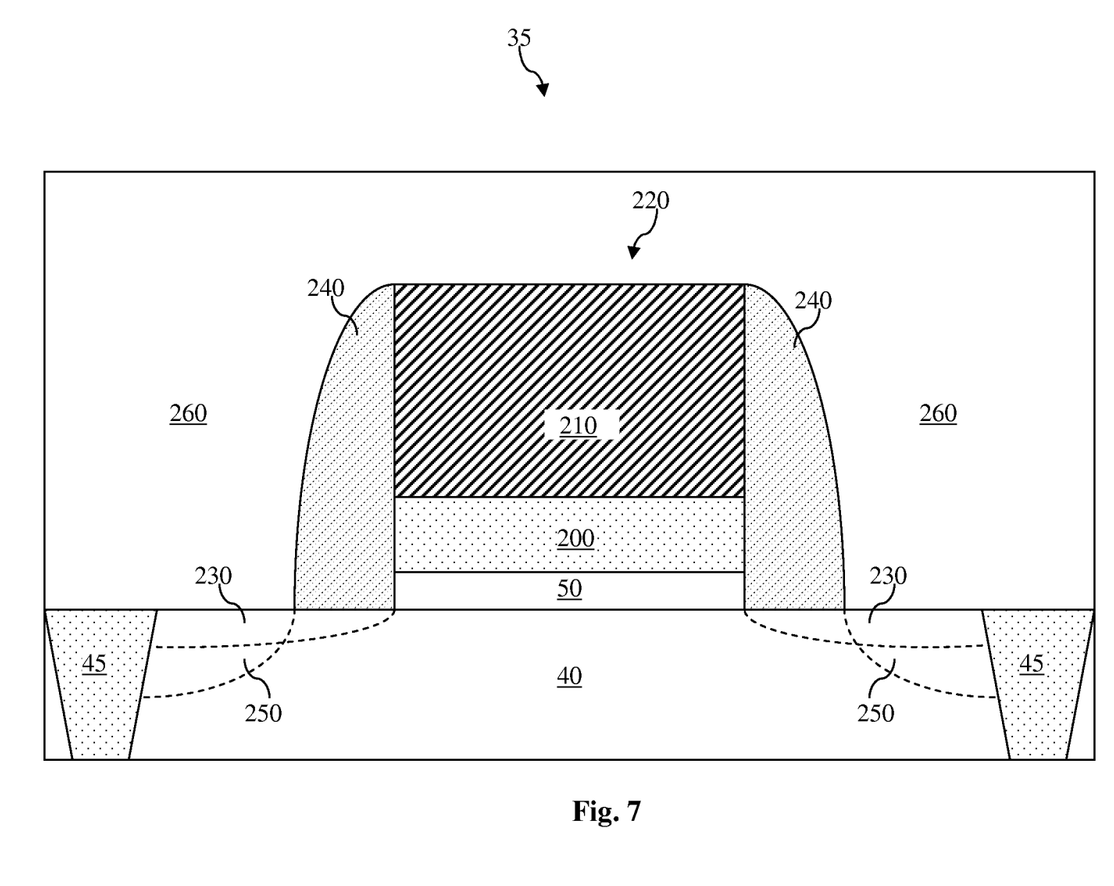

Referring to FIG. 7, an inter-layer (or inter-level) dielectric (ILD) layer 260 is formed over the substrate 40 and the gate structure 220. The ILD layer 260 may be formed by chemical vapor deposition (CVD), high density plasma CVD, spin-on, sputtering, or other suitable methods. In an embodiment, the ILD layer 260 includes silicon oxide. In other embodiments, the ILD layer 260 may include silicon oxy-nitride, silicon nitride, or a low-k material.

Thus, FIGS. 4-7 illustrate the various stage of processing of a "gate first" process. Additional processes may be performed to complete the fabrication of the semiconductor device 35, such as the forming of an interconnect structure and other backend structures known in the art. For the sake of simplicity, these processes are not illustrated herein.

Figure 8:
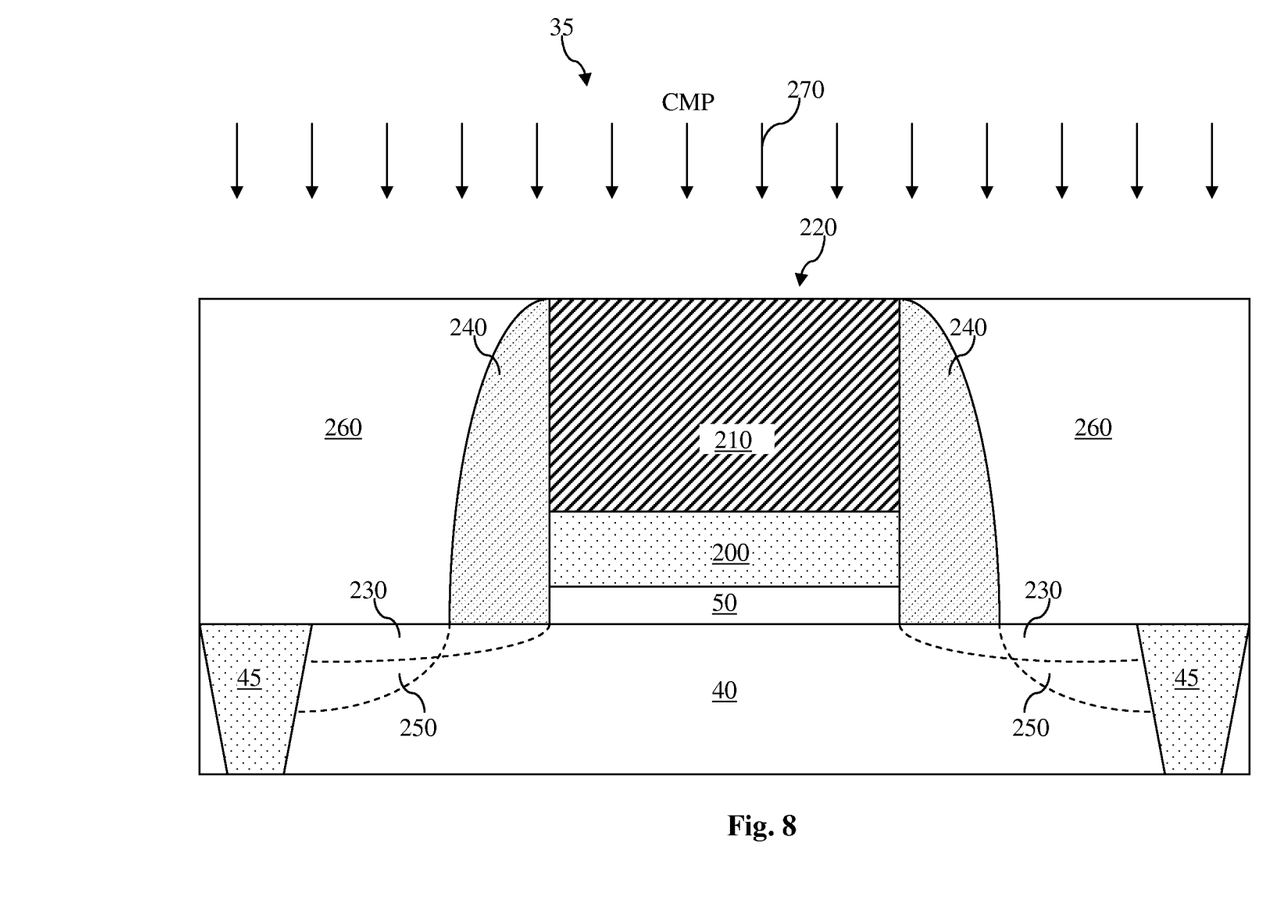
Figure 9:
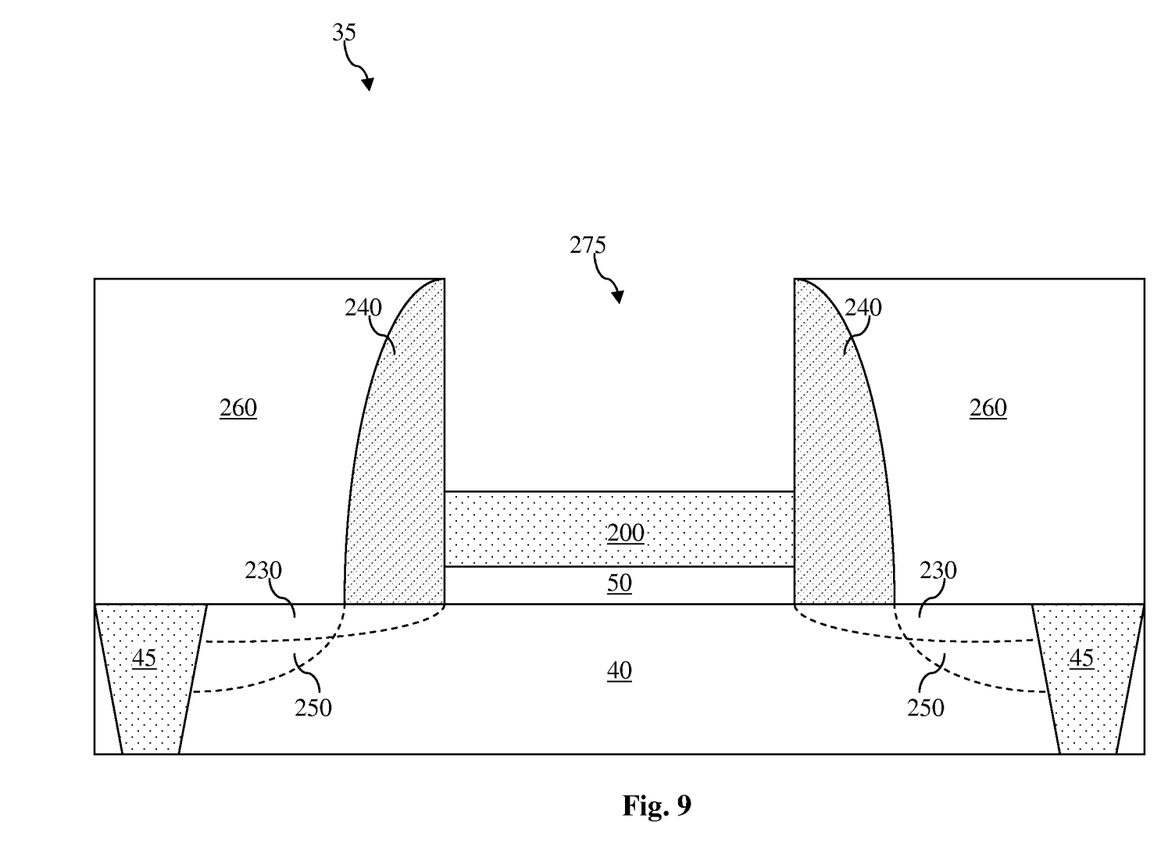
Figure 10:
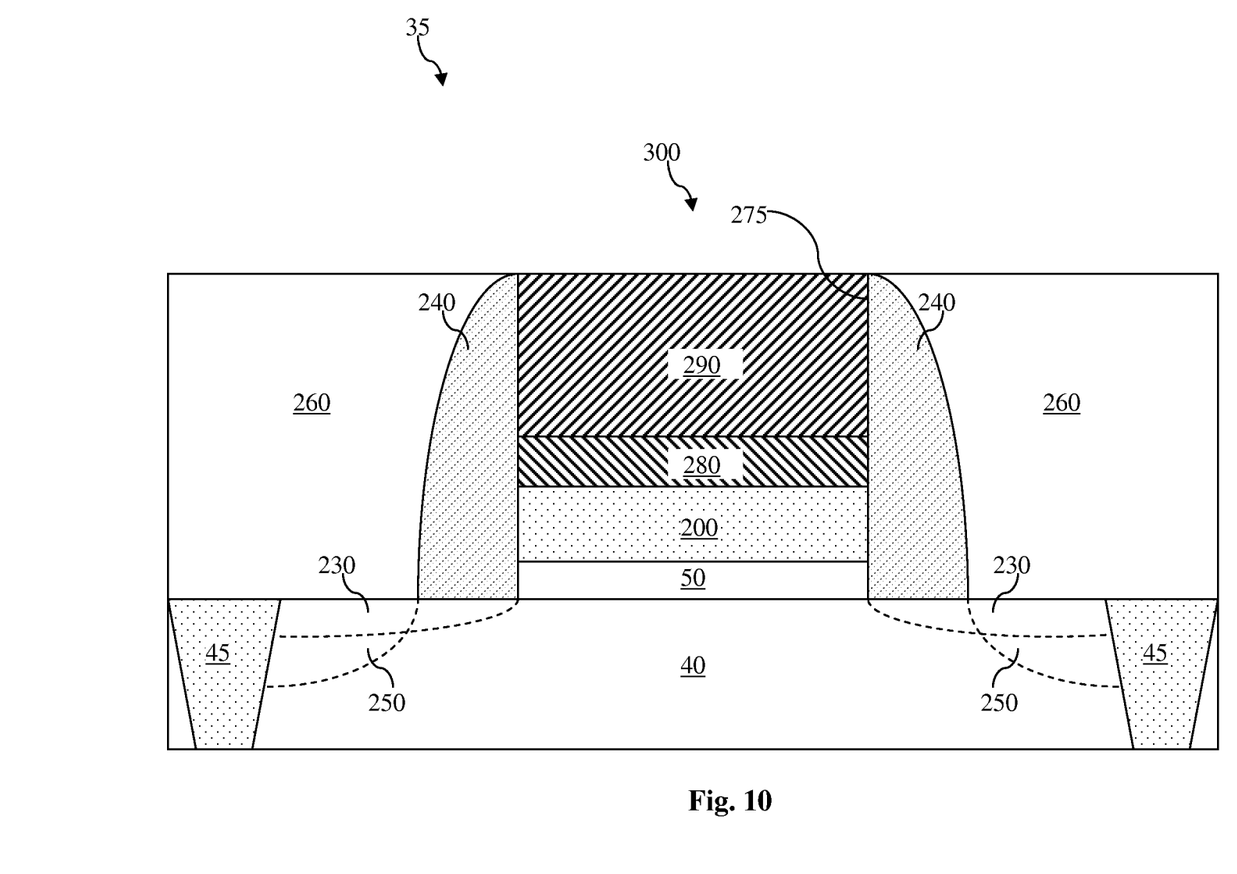

FIGS. 8-10 illustrate the various stages of processing of a "gate last" process that continues after the processing in FIG. 7. Referring to FIG. 8, a chemical-mechanical-polishing (CMP) process 270 is performed on the ILD layer 260 to expose a top surface of the gate structure 220. Following the CMP process 270, the top surface of the gate structure 220 is substantially co-planar with the top surface of the ILD layer 260 on either side of the gate structure 220. Although not illustrated, one or more annealing processes are performed on the semiconductor device 35 to activate the S/D regions 250. These annealing processes may have relatively high temperatures (such as temperatures greater than approximately 700 degrees Celsius) and may be performed before or after the CMP process 270. As discussed above, the laminated gate dielectric layer 200 is capable of withstanding such high annealing temperatures without crystallizing, thus reducing potential gate leakage current.

Referring to FIG. 9, the gate electrode 210 is removed, thereby forming a trench 275 in place of the gate electrode 210. The gate electrode 210 may be removed in a wet etching or a dry etching process known in the art, while the rest of the layers of the semiconductor device 35 remain substantially un-etched, including the gate dielectric layer 200, the gate spacers 240, and the ILD layer 260. Since the gate electrode 210 is removed in the gate last process, it is also referred to as a "dummy gate."

Referring to FIG. 10, a metal layer 280 is formed within the trench 275 and over the gate dielectric layer 200. The metal layer 280 includes one of TiN, TaN, TaC, TaSiN, WN, TiAl, TiAlN, and combinations thereof. The metal layer 280 may alternatively include other metal materials that are suitable for application or manufacturing considerations. The metal layer 280 may be formed by CVD, physical vapor deposition (PVD), or another suitable technique. Thereafter, a metal layer 290 is formed within the trench 275 and over the metal layer 280. The metal layer 290 includes one of tungsten (W), Aluminum (Al), copper (Cu), and combinations thereof. The metal layer 290 may be formed by CVD, PVD, plating, or another suitable technique.

The metal layers 280 and 290 together form a metal gate electrode 300. The metal layer 280 tunes a work function of the semiconductor device 35 so that a desired threshold $V_t$ voltage is achieved. For example, the metal layer 280 may be tuned such that the magnitude of a threshold voltage $V_{tn}$ for an NMOS device is substantially equal to the magnitude of a threshold voltage $V_{tp}$ for a PMOS device. Thus, the metal layer 280 may also be referred to as a work function metal layer. It is understood that a layer similar to the work function metal layer 280 may be formed as a part of the gate electrode layer 210 for the gate first process discussed above with reference to FIGS. 4-7. The metal layer 290 serves as the main conductive portion of the gate electrode 300 and may be referred to as a fill metal layer.

It is understood that additional processes may be performed to complete the fabrication of the semiconductor device 35. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

FIGS. 11A-11D respectively illustrate cross sectional side views of four different samples 310-313 of a gate dielectric layer, the samples being fabricated in accordance with different embodiments of the gate dielectric layer. These four samples 310-313 are each fabricated using 70 cycles of ALD and have respective overall thicknesses 315-318 that are approximately equal to one another.

Figure 11A:
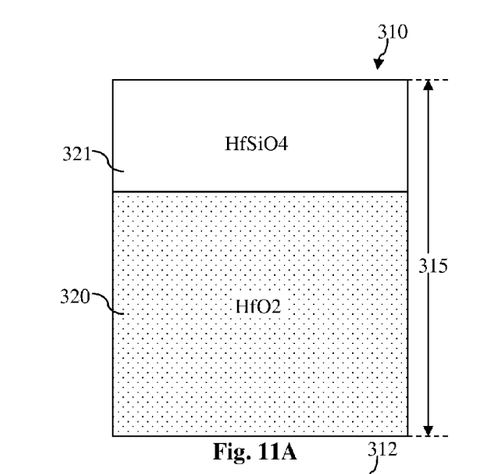
FIGS. 11A-11D illustrate cross-sectional views of four different embodiments of a gate dielectric portion of the semiconductor device that is fabricated according to the method of FIG. 1.

In FIG. 11A, the sample 310 includes dielectric layers 320 and 321. The dielectric layer 320 includes $HfO_2$ that is formed by 56 cycles of ALD. The dielectric layer 321 includes $HfSiO_4$, which is formed by 7 cycles of ALD that deposits $HfO_2$ and 7 cycles of ALD that deposits $SiO_2$. The $HfO_2$ ALD cycles and the $SiO_2$ ALD cycles are alternating. In other words, each $HfO_2$ ALD cycle is followed by a $SiO_2$ ALD cycle.

Figure 11B:
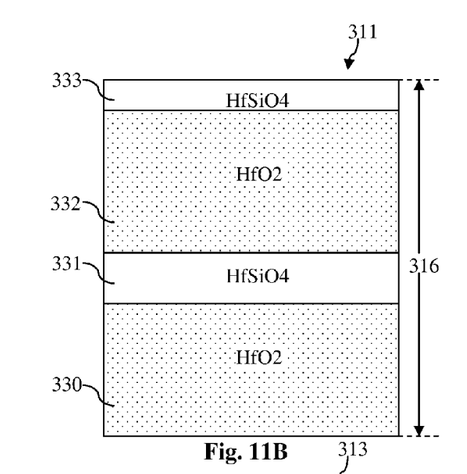

In FIG. 11B, the sample 311 includes dielectric layers 330-333. The dielectric layers 330 and 332 each include $HfO_2$ that is formed by 28 cycles of ALD. The dielectric layers 331 and 333 each include $HfSiO_4$. The $HfSiO_4$ of the dielectric layer 331 is formed by 6 cycles of ALD that deposits $HfO_2$ and 6 cycles of ALD that deposits $SiO_2$. The $HfSiO_4$ of the dielectric layer 333 is formed by a cycle of ALD that deposits $HfO_2$ and a cycle of ALD that deposits $SiO_2$. For the dielectric layers 331 and 333, the $HfO_2$ ALD cycles and the $SiO_2$ ALD cycles are alternating.

Figure 11C:
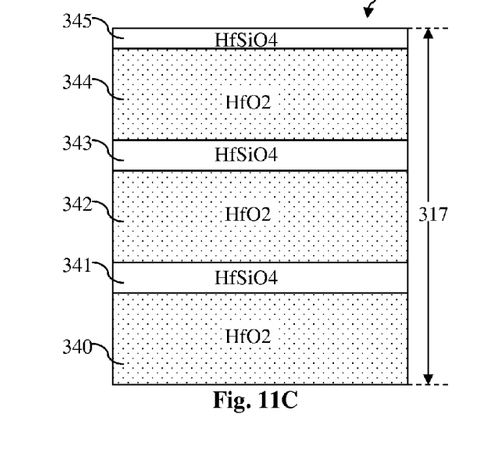

In FIG. 11C, the sample 312 includes dielectric layers 340-345. The dielectric layers 340 and 342 each include $HfO_2$ that is formed by 19 cycles of ALD. The dielectric layer 344 includes $HfO_2$ that is formed by 18 cycles of ALD. The dielectric layers 341, 343 and 345 each include $HfSiO_4$. The $HfSiO_4$ of the dielectric layers 341 and 343 are each formed by 3 cycles of ALD that deposits $HfO_2$ and 3 cycles of ALD that deposits $SiO_2$. The $HfSiO_4$ of the dielectric layer 345 is formed by a cycle of ALD that deposits $HfO_2$ and a cycle of ALD that deposits $SiO_2$. For the dielectric layers 341, 343, and 345, the $HfO_2$ ALD cycles and the $SiO_2$ ALD cycles are alternating.

Figure 11D:
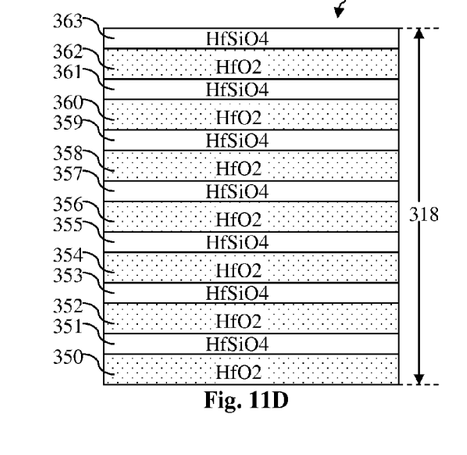

In FIG. 11D, the sample 313 includes the dielectric layers 350-363. The dielectric layers 350, 352, 354, 356, 358, 360, and 362 each include $H_2$ that is formed by 8 cycles of ALD. The dielectric layers 351, 353, 355, 357, 359, 361, and 363 each include $HfSiO_4$, which is formed by a cycle of ALD that deposits $HfO_2$ followed by a cycle of ALD that deposits $SiO_2$.

To gauge the performance of the samples 310-313 under real world high temperature annealing conditions, simulations were run on each of the samples 310-313. Each of the simulations was performed at a different temperature above 700 degrees Celsius. After each simulation, the samples 310-313 were inspected to see if crystallization occurred within the samples. Experimental results show that for sample 310, relatively small crystallized grains begin to form after a 700 degree Celsius rapid thermal annealing (RTA) process. For sample 311, no crystallization was observed within the sample at the 700 degree Celsius RTA process, but there were some signs of crystallization after a 900 degree Celsius RTA process. For samples 312 and 313, no signs of crystallization were observed even after the 900 degree Celsius RTA process. Therefore, it is noted that for a given overall thickness, a gate dielectric having more laminated thin sub-layers tends to have a higher crystallization temperature than a gate dielectric having fewer and thicker laminated sub-layers (or no laminated sub-layers at all).

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising a semiconductor device that includes:
    a substrate;
    a first gate dielectric layer having a first material and being disposed over the substrate;
    a second gate dielectric layer having a second material and being disposed over the first gate dielectric layer;
    a third gate dielectric layer having the first material and being disposed over the second gate dielectric layer;
    a fourth gate dielectric layer having the second material and being disposed over the third gate dielectric layer;
    wherein the first material and the second material each include a high-k material, and wherein the second material is different from the first material, and wherein the first gate dielectric layer is in physical contact with the second gate dielectric layer.

2. The apparatus of claim 1, wherein the first, second, third, and fourth dielectric layers are each thinner than a threshold thicknesses at which a respective portion of the first, second, third, and fourth dielectric materials begins to crystallize.

3. The apparatus of claim 1, wherein the first and second gate dielectric layers have first and second dielectric constants, respectively, wherein the first and second dielectric constants are greater than a dielectric constant of $SiO_2$.

4. The apparatus of claim 1, wherein the semiconductor device further includes:
    a gate electrode disposed over the fourth gate dielectric layer.

5. The apparatus of claim 4, further including
    a fifth gate dielectric layer disposed between the second and third gate dielectric layers; and
    a sixth gate dielectric layer disposed between the fourth gate dielectric layer and the gate electrode;

wherein the fifth and sixth gate dielectric layers each include a third high-k material that is different from the first and second materials.

6. The apparatus of claim 1, wherein:
the first gate dielectric layer includes one of: $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO; and
the second gate dielectric layer includes one of: SiN, AlO, HfO, ZrO, YO, LaO, GdO, TiO, TaO, HfSiO, ZrSiO, TiSiO, TaSiO, HfErO, HfLaO, HfYO, HfGdO, HfAlO, HfZrO, HfTiO, HfTaO, and SrTiO.

7. The apparatus of claim 1, wherein the first gate dielectric layer includes $HfO_2$, and the second gate dielectric layer includes one of $ZrO_2$ and $HfSiO_4$.

8. The apparatus of claim 1, wherein the first and second gate dielectric layers each have a crystallization temperature that is greater than approximately 800 degrees Celsius.

9. An apparatus, comprising a semiconductor device that includes:
a substrate; and
a gate structure disposed over the substrate, the gate structure including a dielectric portion and an electrode portion that is disposed over the dielectric portion;
wherein the dielectric portion contains a plurality of laminated layers that each have a dielectric constant that is greater than approximately twice a dielectric constant of silicon dioxide, and the laminated layers each have a thickness that is less than approximately 0.8 nanometers, and wherein the plurality of laminated layers is at least four, and wherein at least two of the plurality of laminated layers are in direct contact with each other.

10. The apparatus of claim 9, wherein the laminated layers include a plurality of first layers and a plurality of second layers, the first and second layers having different materials and being interleaved.

11. The apparatus of claim 10, wherein:
the first layer includes one of: $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO; and
the second layer includes one of: SiN, AlO, HfO, ZrO, YO, LaO, GdO, TiO, TaO, HfSiO, ZrSiO, TiSiO, TaSiO, HfErO, HfLaO, HfYO, HfGdO, HfAlO, HfZrO, HfTiO, HfTaO, and SrTiO.

12. The apparatus of claim 9, wherein the electrode portion includes first and second metal layers, wherein the first metal layer includes one of TiN and TaN, and the second metal layer includes one of W, Al, and Cu.

13. A method of fabricating a semiconductor device, comprising:
providing a substrate;
forming a first gate dielectric layer having a first material over the substrate;
forming a second gate dielectric layer having a second material directly on the first gate dielectric layer,
forming a third gate dielectric layer having the first material directly on the second gate dielectric layer;
forming a fourth gate dielectric layer having the second material directly on the third gate dielectric layer;
wherein the first material and the second material each include a high-k material, and wherein the second material is different from the first material.

14. The method of claim 13, wherein the first, second, third, and fourth dielectric layers are each thinner than a threshold thickness at which a respective portion of the first, second, third, and fourth dielectric materials begins to crystallize.

15. The method of claim 13, wherein the forming the first and second gate dielectric layers are carried out so that the first and second gate dielectric layers have first and second dielectric constants, respectively, wherein the first and second dielectric constants are greater than a dielectric constant of $SiO_2$.

16. The method of claim 13, further including:
forming a gate electrode over the fourth gate dielectric layer.

17. The method of claim 16, further including, before the forming the gate electrode,
forming a fifth gate dielectric layer over the second gate dielectric layer; and
forming a sixth gate dielectric layer over the fourth gate dielectric layer;
wherein the fifth and sixth gate dielectric layers each include a third high-k material that is different from the first and second materials. wherein the third material is different from the first and second materials.

18. The method of claim 16, wherein the forming the gate electrode is carried out so that the gate electrode includes polysilicon, and further including:
forming source and drain regions in the substrate on either side of the gate electrode;
removing the gate electrode; and
thereafter forming a metal gate electrode over the second gate dielectric layer.

19. The method of claim 13, wherein:
the forming the first gate dielectric layer is carried out so that the first gate dielectric layer includes one of: $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO; and
the forming the second gate dielectric layer is carried out so that the second gate dielectric layer includes one of: SiN, AlO, HfO, ZrO, YO, LaO, GdO, TiO, TaO, HfSiO, ZrSiO, TiSiO, TaSiO, HfErO, HfLaO, HfYO, HfGdO, HfAlO, HfZrO, HfTiO, HfTaO, and SrTiO.

20. The method of claim 13, wherein the forming the first and second gate dielectric layers each include an atomic layer deposition process.

* * * * *